United States Patent
Kang

(10) Patent No.: US 7,602,660 B2
(45) Date of Patent: Oct. 13, 2009

(54) REDUNDANCY CIRCUIT SEMICONDUCTOR MEMORY DEVICE

(75) Inventor: Sang-Hee Kang, Ichon-shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 132 days.

(21) Appl. No.: 11/773,926

(22) Filed: Jul. 5, 2007

(65) Prior Publication Data

US 2008/0186783 A1  Aug. 7, 2008

Related U.S. Application Data

(62) Division of application No. 11/262,105, filed on Oct. 28, 2005, now Pat. No. 7,257,037.

(51) Int. Cl.
*G11C 29/00* (2006.01)
(52) U.S. Cl. .................................. 365/200; 365/185.09
(58) Field of Classification Search .................. 365/200, 365/185.09
See application file for complete search history.

(56) References Cited

U.S. PATENT DOCUMENTS

| 6,041,000 | A  | * | 3/2000 | McClure et al. | 365/200 |
| 6,404,683 | B1 | * | 6/2002 | Yumoto | 365/200 |
| 6,731,560 | B2 | * | 5/2004 | Yoon et al. | 365/222 |
| 6,771,555 | B2 | * | 8/2004 | Kang | 365/230.03 |

FOREIGN PATENT DOCUMENTS

KR  0177407 B1  11/1998

* cited by examiner

*Primary Examiner*—Hoai V Ho
*Assistant Examiner*—Anthan T. Tran
(74) *Attorney, Agent, or Firm*—Townsend and Townsend and Crew LLP

(57) ABSTRACT

A redundancy circuit in a semiconductor memory device comprises a fuse set controller configured to output a redundancy enable signal enabled according to applied address signals; a redundant selector; a spare redundant selector; and a spare fuse controller configured to be controlled by the redundancy enable signal, and to output a selection control signal that selects at least one of the redundant selector and the spare redundant selector in accordance with an internal fuse option.

9 Claims, 10 Drawing Sheets

US 7,602,660 B2

REDUNDANCY CIRCUIT SEMICONDUCTOR MEMORY DEVICE

CROSS REFERENCE TO RELATED APPLICATIONS

The present application is a Divisional application of U.S. patent application Ser. No. 11/262,105, filed Oct. 28, 2005, which contains subject matter related to Korean patent application No. 2005-36227, filed in the Korean Patent Office on Apr. 29, 2005, the entire contents of which is incorporated herein by reference.

BACKGROUND OF THE INVENTION

The present invention relates to a semiconductor device; and, more particularly, to a redundancy circuit in a semiconductor memory device.

In general, a semiconductor memory device undergoes a predetermined test in a wafer state so that undesired cells, word lines, bit lines or the like having errors or defects therein are sort out. Furthermore, the same test is also carried out for a redundancy circuit in order to find out defects. As is well known, the redundancy cell array is required in the semiconductor memory device in order for a cell in the redundancy cell array to perform a normal operation in place of an arbitrary cell in a normal cell array, if the arbitrary cell in the normal cell array cannot perform its function for any reason.

FIG. 1 is a block diagram setting forth a prior art redundancy circuit and FIG. 2 is a timing diagram representing operation of the prior art redundancy circuit.

Herein, a fuse set controller 110 is configured with a fuse set for storing a set of address signals and a controller for controlling the set of address signals.

Referring to FIGS. 1 and 2, in order to test for finding out defects in a predetermined redundancy circuit, a redundancy test signal RED_TEST is applied to the fuse set controller 110 so that the redundancy circuit goes into a test mode after a T2 period. The fuse set controller 110 outputs a redundancy enable signal REDEN<0:3> of logic high level according to a predetermined combination of applied address signals ADDRESS. Afterwards, when a selection control signal SEL_CTRL is applied to a redundant selector 120 while the redundancy enable signal REDEN<0:3> is applied thereto, the redundant selector 120 outputs a redundant selection signal RED_SEL<0:3>. Herein, a T1 period corresponds to an operation time for setting the redundancy circuit and a period between the T1 and the T2 is correspondent to a normal operation time of the redundancy circuit.

However, since one redundant substitution unit is arranged in one fuse set according to the prior art redundancy circuit, there is a drawback that it is impossible to utilize the fuse set if there is any defect in the redundant substitution unit. Meanwhile, although semiconductor memory devices have become smaller as process technology has become more enhanced, an occupation area of the fuse set in the device is still relatively large so that it is difficult to implement a highly integrated device, wherein another problem arises.

BRIEF SUMMARY OF THE INVENTION

The present invention relates to a redundancy circuit in which a plurality of redundant substitution units are arranged in one fuse set for enhancing use efficiency of a fuse set.

In accordance with an embodiment of the present invention, a redundancy circuit of a semiconductor memory device comprises: a fuse set controller for outputting a redundancy enable signal, such redundancy enable signal enabled according to applied address signals; a redundant selector; a spare redundant selector; and a spare fuse controller which is controlled by the redundancy enable signal and configured to output a selection control signal that selects at least one of the redundant selector and the spare redundant selector in accordance with an internal fuse option.

In accordance with another embodiment of the present invention, a redundancy circuit of a semiconductor memory device comprises: a fuse set controller for outputting a redundancy enable signal, such fuse set controller enabled according to applied address signals; a redundant selector for outputting a redundant selection signal; a spare redundant selector for outputting a spare redundant selection signal; and a spare fuse controller which is controlled by the redundancy enable signal and configured to output a selection control signal that selects at least one of the redundant selector and the spare redundant selector in accordance with an internal fuse option during a normal mode or a predetermined address signal corresponding to the redundant selection signal during a test mode.

In accordance with still another embodiment of the present invention, a redundancy circuit of a semiconductor memory device comprises: a fuse set controller for outputting a redundancy enable signal, such fuse set controller enabled according to applied address signals; a spare fuse unit for outputting a plurality of fuse-out signals of predetermined logic levels corresponding to an internal spare fuse option; a redundant selector controlled by a selection control signal applied from an exterior source configured to output the redundancy enable signal as a normal selection control signal; and a multiplexer for enabling a redundant selection signal or a spare redundant selection signal in accordance with the plurality of fuse-out signals.

BRIEF DESCRIPTION OF THE DRAWINGS

The above description and other features of the present invention will become apparent from the following description of embodiments taken in conjunction with the accompanying drawings, in which.

DETAILED DESCRIPTION OF THE INVENTION

The present invention will now be described more fully with reference to the accompanying drawings, in which exemplary embodiments of the invention are shown.

Figure 3:
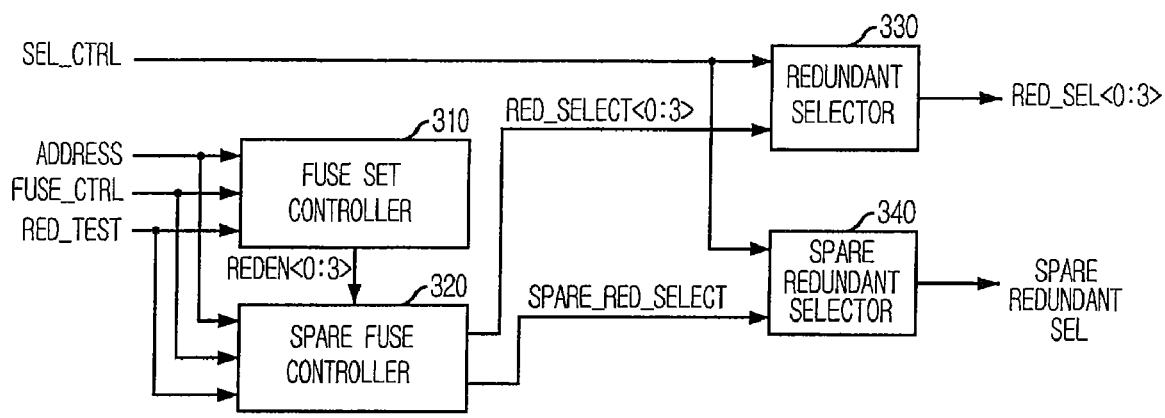
FIG. 3 is a block diagram setting forth a redundancy circuit of a semiconductor memory device in accordance with a first embodiment of the present invention.

FIG. 3 is a block diagram setting forth a redundancy circuit in accordance with a first embodiment of the present invention.

Referring to FIG. 3, the inventive redundancy circuit includes a fuse set controller 310, a spare fuse controller 320, a redundant selector 330, and a spare redundant selector 340.

In one embodiment of the present invention, the fuse set controller 310 of the present invention has the same constitution with that of the prior art redundancy circuit. The fuse set controller 310 outputs redundancy enable signals REDEN<0:3> of logic high levels according to a predetermined combination of applied address signals ADDRESS.

The spare fuse controller 320 enables redundant selection control signals RED_SELECT<0:3> or a spare redundant selection control signal SPARE RED_SELECT according to a fuse option in a normal mode. In addition, in a test mode, the spare fuse controller 320 may enable the redundant selection control signals RED_SELECT<0:3> or the spare redundant selection control signals SPARE RED_SELECT according to predetermined command signals corresponding to redundant selection signal RED_SEL<0:3> enabled at the test mode, e.g., predetermined address signals ADDRESS<0:3>.

The redundant selector 330 performs a logic operation to the redundant selection control signals RED_SELECT<0:3> and a selection control signal SEL_CTRL so as to output redundant selection signals RED_SEL<0:3> for selecting a redundancy address corresponding thereto.

The spare redundant selector 340 performs a logic operation to the spare redundant selection control signals SPARE RED_SELECT and the selection control signal SEL_CTRL so as to output a spare redundant selection signal SPARE REDUNDANT SEL for selecting a spare redundancy address corresponding thereto.

Figure 4:
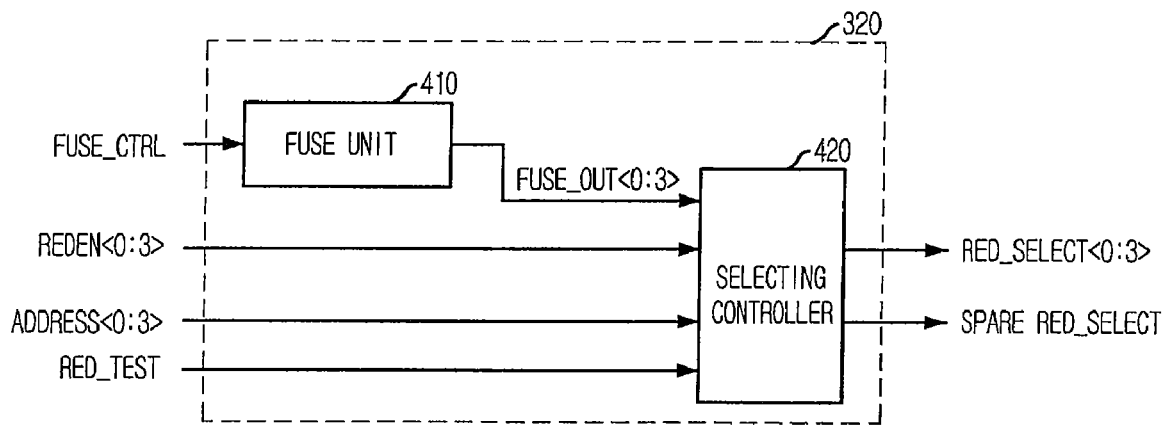
FIG. 4 is a block diagram setting forth a configuration of a spare fuse controller in accordance with an embodiment of the present invention.

FIG. 4 is a block diagram setting forth a configuration of the spare fuse controller 320 in accordance with the first embodiment of the present invention.

Referring to FIG. 4, the spare fuse controller 320 includes a spare fuse unit 410 and a selecting controller 420. In accordance with an embodiment of the present invention, the spare fuse unit 410 is initialized by means of a fuse control signal FUSE_CTRL and the spare fuse unit 410 may output fuse-out signals FUSE_OUT<0:3> having predetermined logic levels corresponding to a connection or a disconnection of the spare fuse unit 410.

The selecting controller 420 enables the redundant selection control signal RED_SELECT<0:3> or the spare redundant selection control signal SPARE RED_SELECT according to logic levels of the fuse-out signals FUSE_OUT<0:3> in a normal mode. Additionally, the selecting controller 420 may enable the redundant selection control signals RED_SELECT<0:3> or the spare redundant selection control signals SPARE RED_SELECT according to predetermined command signals corresponding to redundant selection signal RED_SEL<0:3> enabled at the test mode, e.g., predetermined address signals ADDRESS<0:3>.

Figure 5:
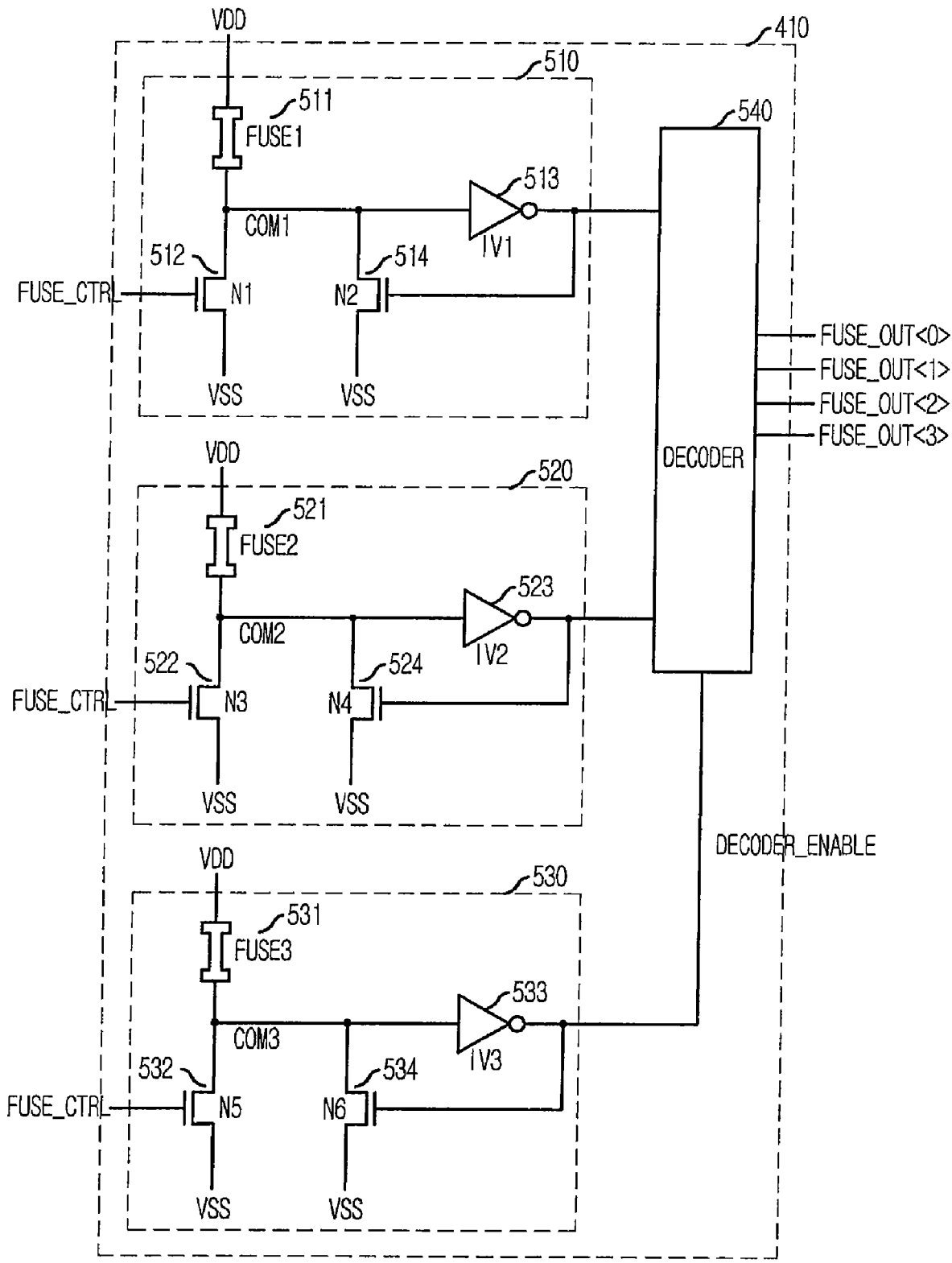
FIG. 5 is a circuit diagram setting forth a spare fuse unit of the redundant circuit in accordance with an embodiment of the present invention.

FIG. 5 is a circuit diagram setting forth the spare fuse unit 410 of the redundant circuit in accordance with the first embodiment of the present invention.

Referring to FIG. 5, the spare fuse unit 410 includes a first spare fuse output unit 510, a second spare fuse output unit 520, a decoder enable signal generator 530, and a decoder 540. The spare fuse unit 410 outputs the fuse-out signals FUSE_OUT<0:3> having predetermined logic levels corresponding to a connection or a disconnection state of a first fuse FUSE1 and a second fuse FUSE2.

In one embodiment of the present invention, the first spare fuse output unit 510 is provided with a first fuse 511 disposed between a power voltage VDD and a first common node COM1, a first NMOS transistor 512 controlled by the fuse control signal FUSE_CTRL of which ends are connected to the first common node COM1 and a ground voltage VSS, a first inverter 513 for inverting a logic level of the first common node COM1, and a second NMOS transistor 514 controlled by the output of the first inverter 513 of which ends are connected to the first common node COM1 and the ground voltage VSS. When the fuse control signal FUSE_CTRL of logic high level is applied under the condition that first fuse 511 is disconnected, the logic level of the first common node COM1 becomes low. On the contrary, when the fuse control signal FUSE_CTRL of a logic high level is applied under the condition that first fuse 511 is connected, the logic level of the first common node COM1 becomes high.

The second spare fuse output unit 520 is provided with a second fuse 521 disposed between the power voltage VDD and a second common node COM2, a third NMOS transistor 522 controlled by the fuse control signal FUSE_CTRL of which ends are connected to the second common node COM2 and the ground voltage VSS, a second inverter 523 for inverting a logic level of the second common node COM2, and a fourth NMOS transistor 524 controlled by the output of the second inverter 523 of which ends are connected to the second common node COM2 and the ground voltage VSS.

The decoder enable signal generator 530 has the same constitution with that of the first spare fuse output unit 510 so that further description for its constitution will be omitted herein. In one embodiment of the present invention, the decoder enable signal generator 530 is required for cutting off the output of decoder 540, when the spare fuse unit is not used.

The decoder 540 is enabled after being controlled by a decoder enable signal DECODER_ENABLE outputted from the decoder enable signal generator 530. Thereafter, the decoder 540 outputs a first to a fourth fuse-out signals FUSE_OUT<0:3> by decoding the output signals of the first and the second spare fuse output units 510 and 520, which correspond to the connection states of the first and the second spare fuses 511 and 521.

According to one embodiment of the present invention, though it is not shown in the drawings, each of the first and the second spare fuse output units 510 and 520 and the decoder enable signal generator 530 may be provided with a fuse interconnected between a ground voltage VSS and a common node, an NMOS transistor controlled by the fuse control signal FUSE_CTRL which is interconnected between the common node and the power voltage VDD, an inverter for inverting a logic level of the common node, and another NMOS transistor controlled by the output of the inverter which is interconnected between the common node and the power voltage VDD.

Figure 6:
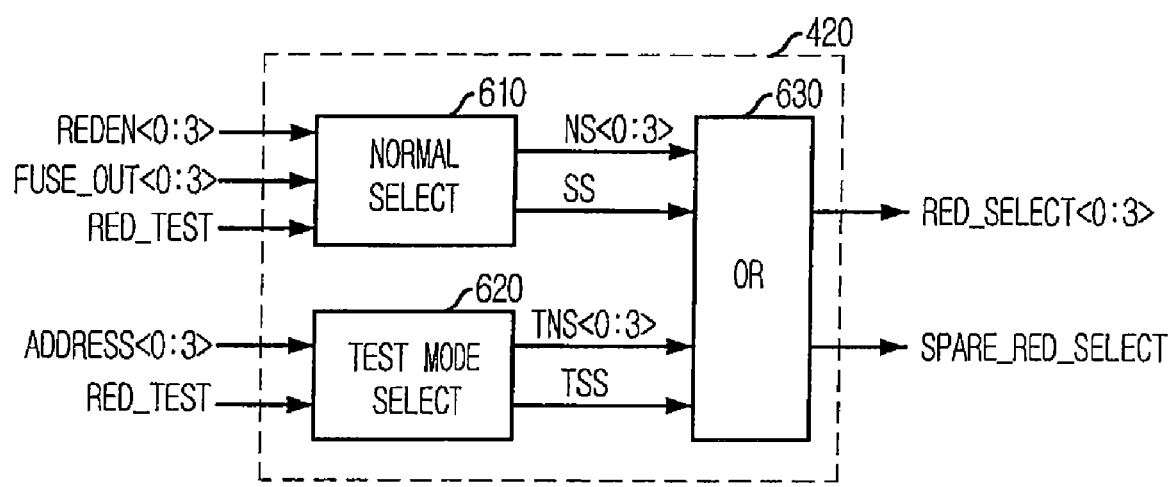
FIG. 6 is a block diagram setting forth a detail configuration of a selecting controller in accordance with an embodiment of the present invention.

FIG. 6 is a block diagram setting forth a configuration of the selecting controller 420 in accordance with the first embodiment of the present invention.

Although the selecting controller 420 is not limited to the scope of the description, it may be configured with a normal selector 610.

In one embodiment of the present invention, the normal selector 610 enables normal selection control signals NS<0:3> or a spare selection control signal SS according to logic levels of the fuse-out signals FUSE_OUT<0:3>, in response to the redundancy enable signals REDEN<0:3> applied during a normal mode, wherein the redundancy test signal RED_TEST is in a logic low level. Herein, it is possible to make use of the normal selection control signal NS<0:3> and the spare selection control signal SS as the redundant selection control signal RED_SELECT<0:3> and the spare redundant selection control signal SPARE RED_SELECT, respectively.

In an alternative embodiment of the present invention, the selecting controller 420 may comprise a normal selector 610, a test mode selector 620, and a signal coupler 630 as depicted in FIG. 6.

The normal selector 610 enables the normal selection control signals NS<0:3> or the spare selection control signal SS in the normal mode, wherein the redundancy test signal RED_TEST is in a logic low level. According to one embodiment of the present invention, the spare redundant selection signal SPARE RED_SELECT may replace any number of the first to the fourth redundant selection signals of RED_SEL<0:3> according to the logic levels of the fuse-out signals FUSE_OUT<0:3>. In response to the applied redundancy enable signals REDEN<0:3>, the first to the fourth redundant selection control signals RED_SELECT<0:3> or the spare redundant selection signal SPARE RED_SELECT may be enabled.

In one embodiment of the present invention, during the test mode where the redundancy test signal RED_TEST is in a logic high level, the normal selection control signals NS<0:3> and the spare selection control signal SS are set to a logic low level so that the normal selector 610 is not in operation.

The test mode selector 620 enables test mode selection control signal TNS<0:3> or a test mode spare selection control signal TSS, enabled at the test mode where the redundancy test signal RED_TEST is in a logic high level.

In accordance with an embodiment of the present invention, the signal coupler 630 performs a logic OR operation to the normal selection control signals NS<0:3> and the test mode selection control signals TNS<0:3>, as well as a logic OR operation to the spare selection control signal SS and the test mode spare selection control signal TSS.

Figure 7:
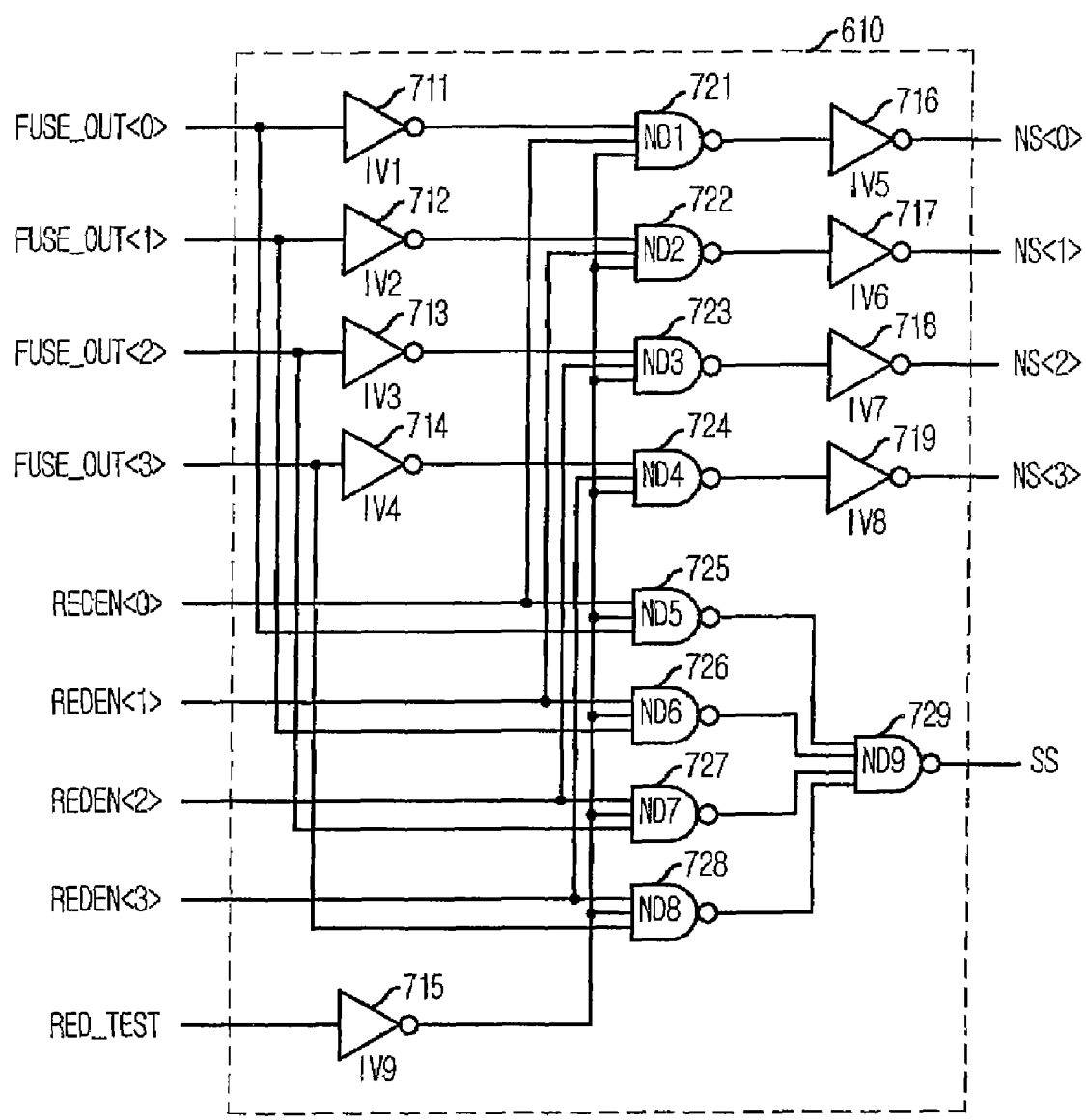
FIG. 7 is a circuit diagram setting forth a normal selector of the selecting controller in accordance with an embodiment of the present invention.

FIG. 7 is a circuit diagram setting forth the normal selector 610 of the selecting controller 420 in accordance with an embodiment of the present invention.

Referring to FIG. 7, the normal selector 610 comprises a first to a ninth inverters 711 to 719 and a first to a ninth NAND gates 721 to 729. Herein, the first inverter 711 is used for inverting a first fuse-out signal FUSE_OUT<0> and the second inverter 712 is used for inverting a second fuse-out signal FUSE_OUT<1>. Likewise, the third and the fourth inverters 713 and 714 invert a third fuse-out signal FUSE_OUT<2> and a fourth fuse-out signal FUSE_OUT<3> respectively. The fifth inverter 715 inverts the redundancy test signal RED_TEST.

In accordance with an embodiment of the present invention, the first NAND gate 721 performs a logic NAND operation to the output of the first inverter 711, a first redundancy enable signal REDEN<0>, and the output of the fifth inverter 715. The second NAND gate 722 performs a logic NAND operation to the output of the second inverter 712, a second redundancy enable signal REDEN<1>, and the output of the fifth inverter 715. Likewise, the third NAND gate 723 performs a logic NAND operation to the output of the third inverter 713, a third redundancy enable signal REDEN<2>, and the output of the fifth inverter 715. The fourth NAND gate 724 performs a logic NAND operation to the output of the fourth inverter 714, a fourth redundancy enable signal REDEN<3>, and the output of the fifth inverter 715.

The fifth NAND gate 725 performs a logic NAND operation to the first fuse-out signal FUSE_OUT<0>, the first redundancy enable signal REDEN<0>, and the output of the fifth inverter 715. Likewise, the sixth NAND gate 726 performs a logic NAND operation to the second fuse-out signal FUSE_OUT<1>, the second redundancy enable signal REDEN<1>, and the output of the fifth inverter 715. The seventh NAND gate 727 performs a logic NAND operation to the third fuse-out signal FUSE_OUT<2>, the third redundancy enable signal REDEN<2>, and the output of the fifth inverter 715. The eighth NAND gate 728 performs a logic NAND operation to the fourth fuse-out signal FUSE_OUT<3>, the fourth redundancy enable signal REDEN<3>, and the output of the fifth inverter 715.

In accordance with an embodiment of the present invention, the ninth NAND gate 729 plays a role in performing a logic NANAD operation to the outputs of the fifth to the eighth NAND gates 725, 726, 727, and 728.

In one embodiment of the present invention, a sixth to a ninth inverters 716, 717, 718, and 719 are used for inverting only the output of the first to the fourth NAND gates 721, 722, 723, and 724. It should be appreciated that the first NAND gate 721 and the sixth inverter 716 may be substituted by one AND gate. In accordance with an embodiment of the present invention, in the test mode where the redundancy test signal RED_TEST is in a logic high level, the normal selection control signal NS<0:3> and the spare selection control signal SS are set to a logic low level, wherein the normal selector 610 is not in operation.

Figure 8:
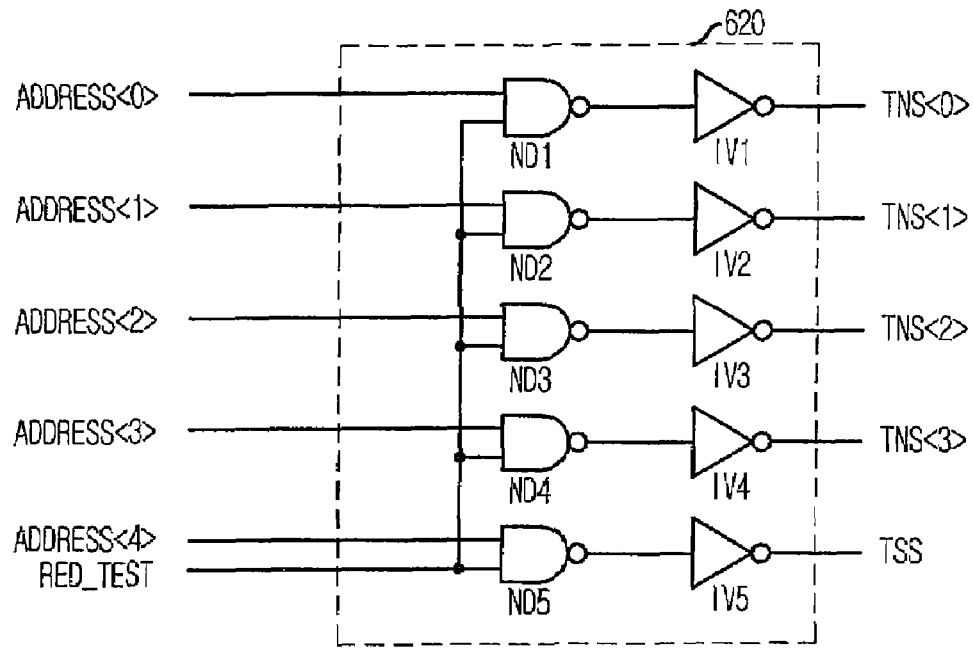
FIG. 8 is a circuit diagram setting forth a test mode selector of the selecting controller in accordance with an embodiment of the present invention.

FIG. 8 is a circuit diagram setting forth the test mode selector 620 of the selecting controller 420 in accordance with the first embodiment of the present invention.

Referring to FIG. 8, the test mode selector 620 performs logic operation to the address signals ADDRESS<0:3>, the address signal ADDRESS<4>, and the redundancy test signal RED_TEST, to thereby enable the redundant selection control signals RED_SELECT<0:3> or the spare redundant selection control signal SPARE RED_SELECT.

Figure 9:
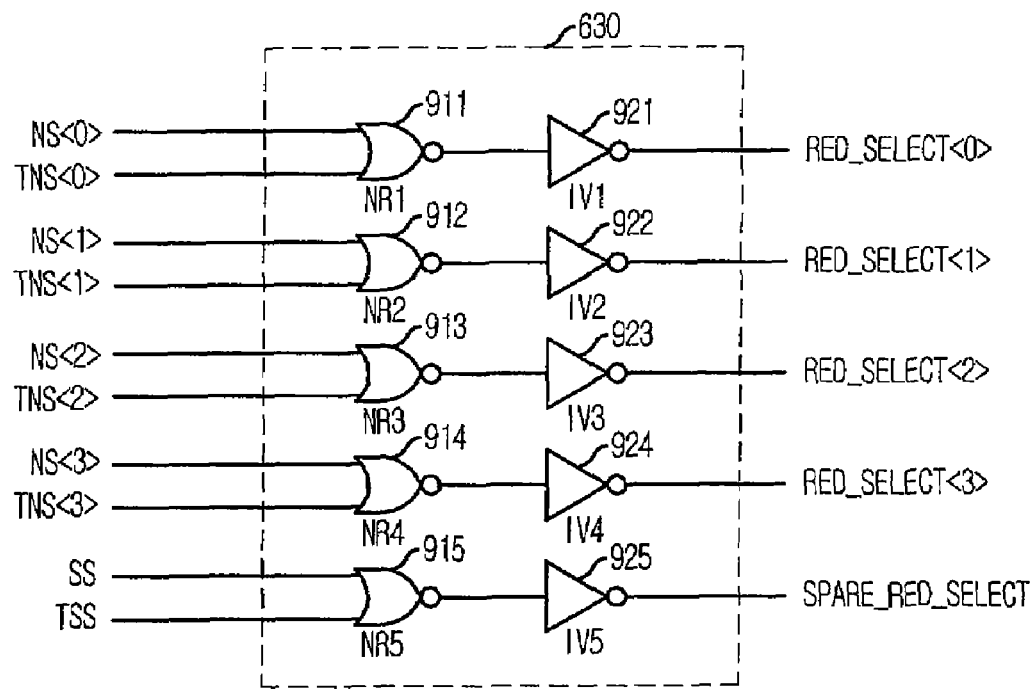
FIG. 9 is a circuit diagram setting forth a signal coupler of the selecting controller in accordance with an embodiment of the present invention.

FIG. 9 is a circuit diagram setting forth the signal coupler 630 of the selecting controller 420 in accordance with an embodiment of the present invention.

Referring to FIG. 9, the signal coupler 630 comprises a first to a fourth NOR gates for performing a logic NOR operation to the first to the fourth normal selection control signals NS<0:3> and the first to the fourth test mode selection control signals TNS<0:3>, and a fifth NOR gate 915 for performing a logic NOR operation to the spare selection control signal SS and the test mode spare selection control signal TSS.

In accordance with an embodiment of the present invention, a first to a fifth inverters 921 to 925 are used for inverting only the outputs of the first to the fifth NOR gates 911 to 915. It should be appreciated that the first NOR gate 911 and the first inverter 921 may be substituted by one OR gate, the second NOR gate 921 and the second inverter 922 may be substituted by one OR gate, etc.

Figure 10:
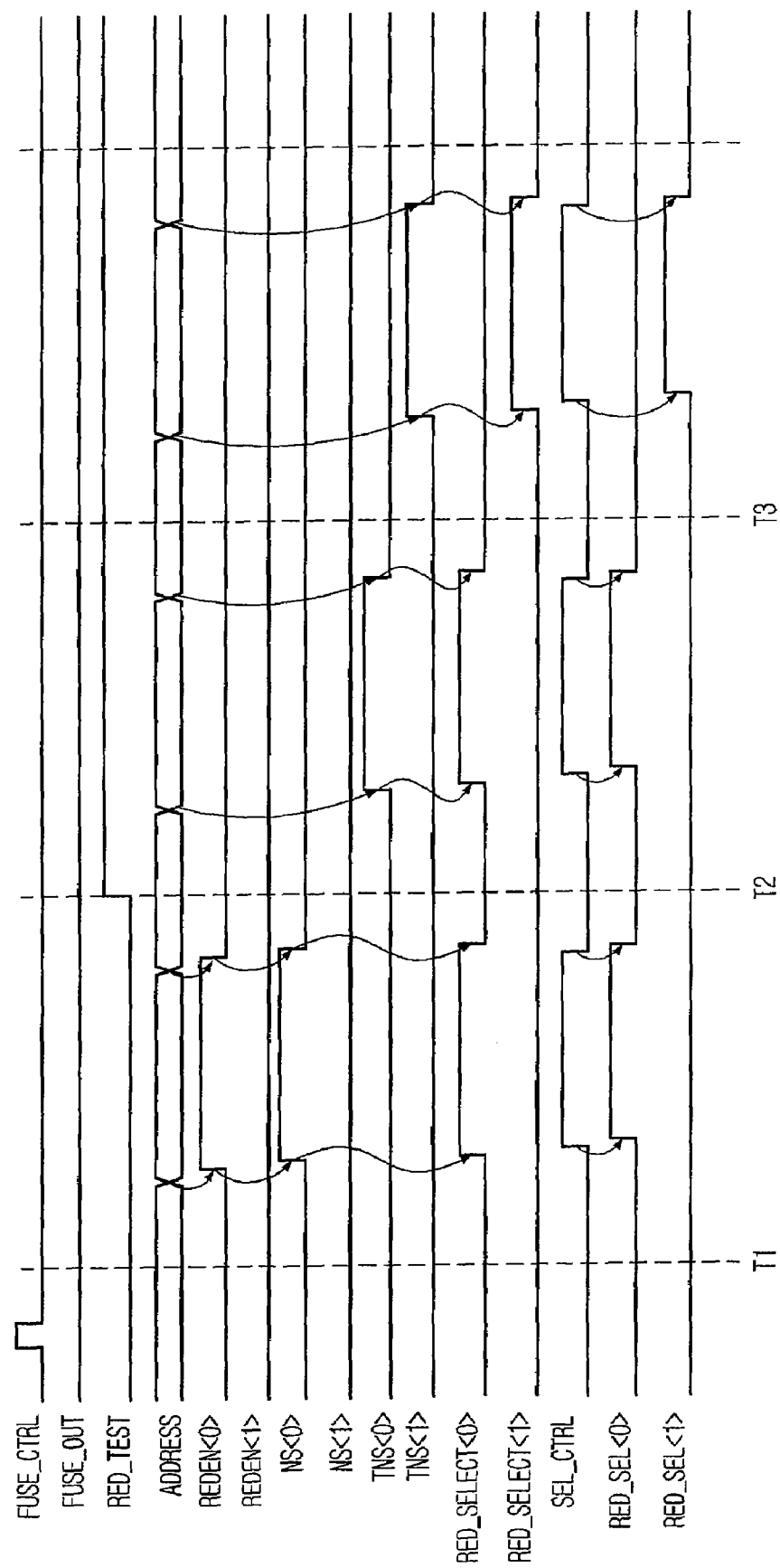
FIG. 10 is a timing diagram of the redundancy circuit in accordance with an embodiment of the present invention when the spare fuse unit is connected.

FIG. 10 is a timing diagram of the redundancy circuit in accordance with an embodiment of the present invention when the spare fuse unit is connected, wherein the fuse-out signals FUSE_OUT<0:3> are set to a logic low level.

First Period (T1-T2)

The first period is a normal operation period that the redundancy test signal RED_TEST is in a logic low level, and thus the first and the second fuses 511 and 512 are connected to their own parts as shown in FIG. 5.

The fuse set controller 310 outputs the redundancy enable signal REDEN<0:3> by combining the address signals ADDRESS applied from an exterior source. Referring to FIG. 10, for instance, though it is shown that the first redundancy enable signal REDEN<0> turns to a logic high level, the first to the fourth redundancy enable signals<0:3> may be enabled, i.e., set to a logic high level, respectively.

In one embodiment of the present invention, the spare fuse unit 410 may output the first fuse-out signal FUSE_OUT<0> of a logic low level under the condition that the first fuse 511 and the second fuse 512 are connected to their own parts. At this time, the normal selector 610 of the selecting controller 420 is controlled by the first redundancy enable signal REDEN<0> which is set to a logic high level. Thus, the normal selector 610 enables the first normal selection control signal NS<0> by setting the control signal to a logic high level. On the contrary, since the redundancy test signal RED_TEST keeps a logic low level, the test mode selector 620 maintains the test mode selection control signals TNS<0:3> and the test mode spare selection control signal TSS in a logic low level so that the test mode selector 620 does not operate. Furthermore, because the first normal selection control signal NS<0> is set to a logic high level, the signal coupler 630 sets the first redundant selection control signal RED_SELECT<0> to a logic high level, and subsequently the redundant selector 330 controlled by the selection control signal SEL_CTRL enables (i.e., sets to a logic high level) the first redundant selection signal RED_SEL<0>.

2) Second Period (T2-T3)

The second period is the test mode period that the redundancy test signal RED_TEST is in a logic high level.

In one embodiment of the present invention, the test mode selector 620 sets the first test mode selection control signal TNS<0> to a logic high level and the signal coupler 630 sets the first redundant selection control signal RED_SELECT<0> to a logic high level. Furthermore, the redundant selector 330 controlled by the selection control signal SEL_CTRL enables (i.e., sets to a logic high level) the first redundant selection signal RED_SEL<0>. In accordance with an embodiment of the present invention, the output of the normal selector 610 has no effect on the signal coupler 630 because the redundancy test signal RED_TEST of a logic high level sets the spare selection control signal SS and the normal selection control signals NS<0:3> outputted from the normal selector 610 to a logic low level.

3) Third Period (After T3)

The third period is the test mode period that the redundancy test signal RED_TEST and the second test mode selection control signal TNS<1> are in a logic high level.

In one embodiment of the present invention, the operational mechanism for the third period is the same as that for the second period. However, there is a difference in that the second redundant selection signal RED_SEL<1> is set to a logic high level instead of the first redundant selection signal RED_SEL<0> being set to a logic high level, because the second test mode selection control signal TNS<1> is set to a logic high level instead of the first test mode selection control signal TNS<0> being set to a logic high level, shown in the second period.

Figure 11:
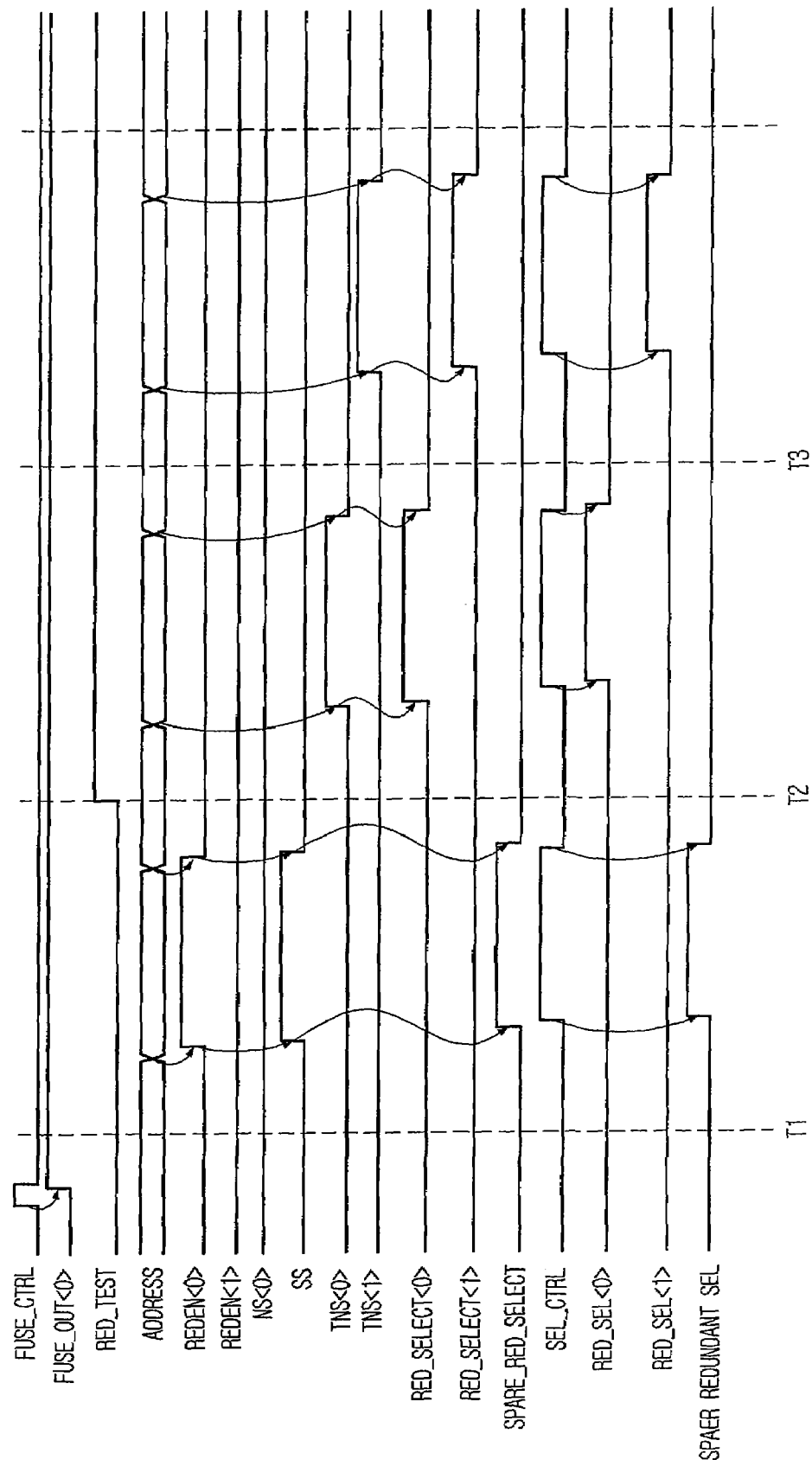
FIG. 11 is a timing diagram of the redundancy circuit in accordance with an embodiment of the present invention when the spare fuse is disconnected.

FIG. 11 is a timing diagram of the redundancy circuit in accordance with the first embodiment of the present invention, wherein the spare fuse is disconnected, and the first fuse-out signal FUSE_OUT<0> is in a logic high level.

1) First Period (T1-T2)

The first period is a normal operation period that the redundancy test signal RED_TEST is in a logic low level and the first fuse-out signal FUSE_OUT<0> is in a logic high level.

The fuse set controller 310 outputs the redundancy enable signal REDEN<0:3> by combining the address signals ADDRESS applied from an exterior source. For example, provided that the first redundancy enable signal REDEN<0> is set to a logic high level, the normal selector 610 of the selecting controller 420 is controlled by the first redundancy enable signal REDEN<0> which is set to a logic high level, thereby setting the spare selection control signal SS to a logic high level. Since the redundancy test signal RED_TEST is kept at a logic low level, the test mode selector 620 maintains the test mode selection control signal TNS<0:3> and the test mode spare selection control signal TSS in a logic low level so that the test mode selector 620 does not operate.

Furthermore, because the spare selection control signal SS is set to a logic high level, the signal coupler 630 sets the spare redundant selection control signal SPARE RED_SELECT to a logic high level. In addition, the spare redundant selector 340 controlled by the selection control signal SEL_CTRL enables (i.e., sets to a high logic level) the spare redundant selection signal SPARE REDUNDANT SEL.

2) Second Period (T2-T3) and Third Period (after T3)

Since these periods are in the test mode period where the redundancy test signal RED_TEST is in a logic high level, the operational mechanism is same to that of the descriptions in FIG. 10, and further illustrations will be omitted herein.

Figure 12:
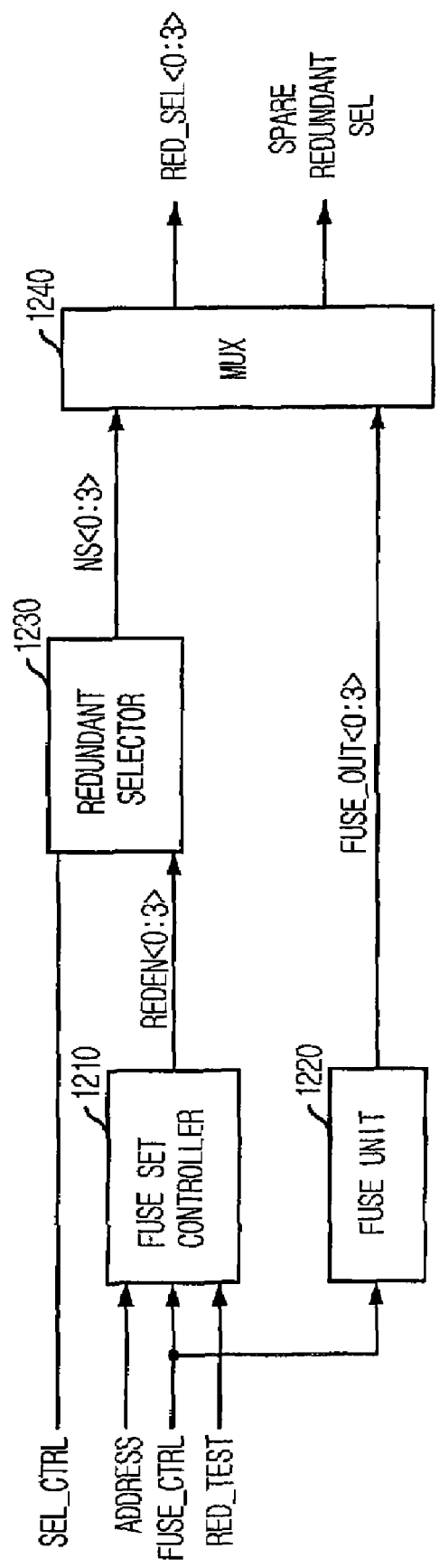
FIG. 12 is a block diagram setting forth a redundancy circuit in accordance with a second embodiment of the present invention.

FIG. 12 is a block diagram setting forth a redundancy circuit in accordance with a second embodiment of the present invention.

Referring to FIG. 12, the redundancy controller of the second embodiment comprises a fuse set controller 1210, a spare fuse unit 1220, a redundant selector 1230, and a multiplexer 1240.

Figure 1:
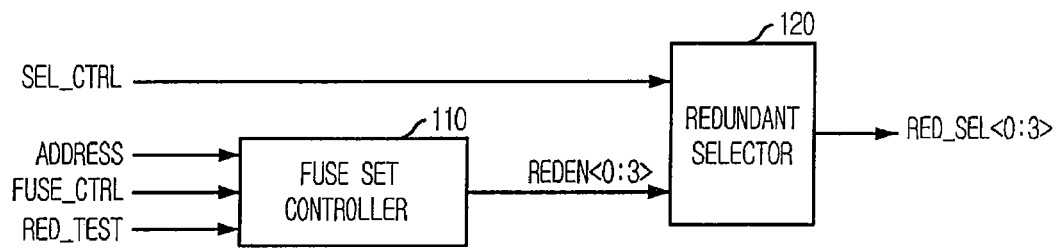
FIG. 1 is a block diagram setting forth a prior art redundancy circuit.
Figure 2:
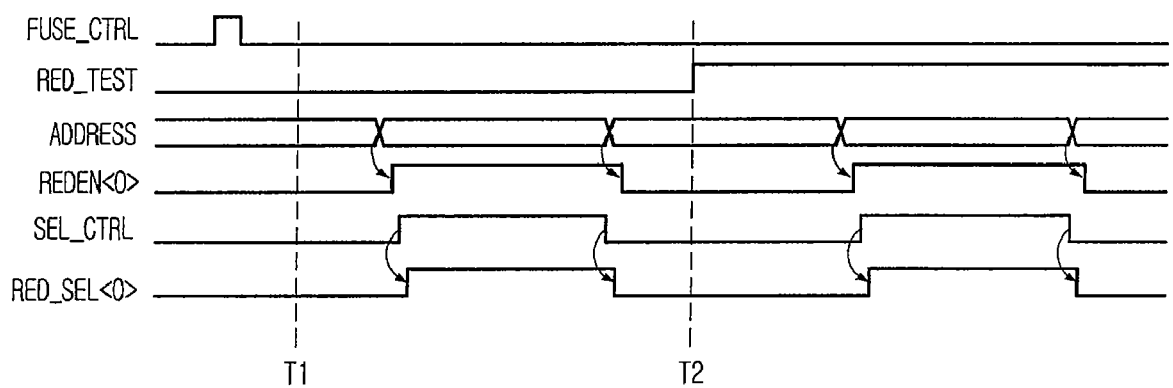
FIG. 2 is a timing diagram representing operation of the prior art redundancy circuit.

In one embodiment of the present invention, the fuse set controller 1210 has the same constitution with that of the fuse set controller of FIG. 1, and outputs the redundancy enable signals REDEN<0:3> which is enabled by a predetermined combination of applied address signals ADDRESS.

In one embodiment of the present invention, the spare fuse unit 1220 has the same configuration with that of the spare fuse unit of FIG. 5, and outputs the fuse-out signals FUSE_OUT<0:3> of which logic levels are determined according to the connection state of the first and the second spare fuses FUSE1 and FUSE2.

The redundant selector 1230 which is controlled by the selection control signal SEL_CTRL outputs the enabled redundancy enable signals REDEN<0:3> as the normal selection control signals NS<0:3>.

In accordance with an embodiment of the present invention, the multiplexer 1240 enables the first to the fourth redundant selection signals RED_SEL<0:3> normally under the condition that the first and the second spare fuses FUSE1 and FUSE2 are connected to their own parts. However, when a predetermined signal having a logic level different from the other signals, i.e., among the first to the fourth fuse-out signals FUSE_OUT<0:3>, the multiplexer 1240 enables the spare redundant selection signal SPARE REDUNDANT SEL and the redundant selection signals except a redundant selection signal corresponding to the predetermined signal having the different logic level. For example, if the first fuse-out signal FUSE_OUT<0> has a logic level different from that of the second to the fourth fuse-out signals FUSE<1:3>, the multiplexer 1240 enables the spare redundant selection signal SPARE REDUNDANT_SEL and the second to the fourth redundant selection signals RED_SEL<1:3> except the first redundant selection signal RED_SEL<0> corresponding to the first fuse-out signal FUSE_OUT<0>.

Figure 13:
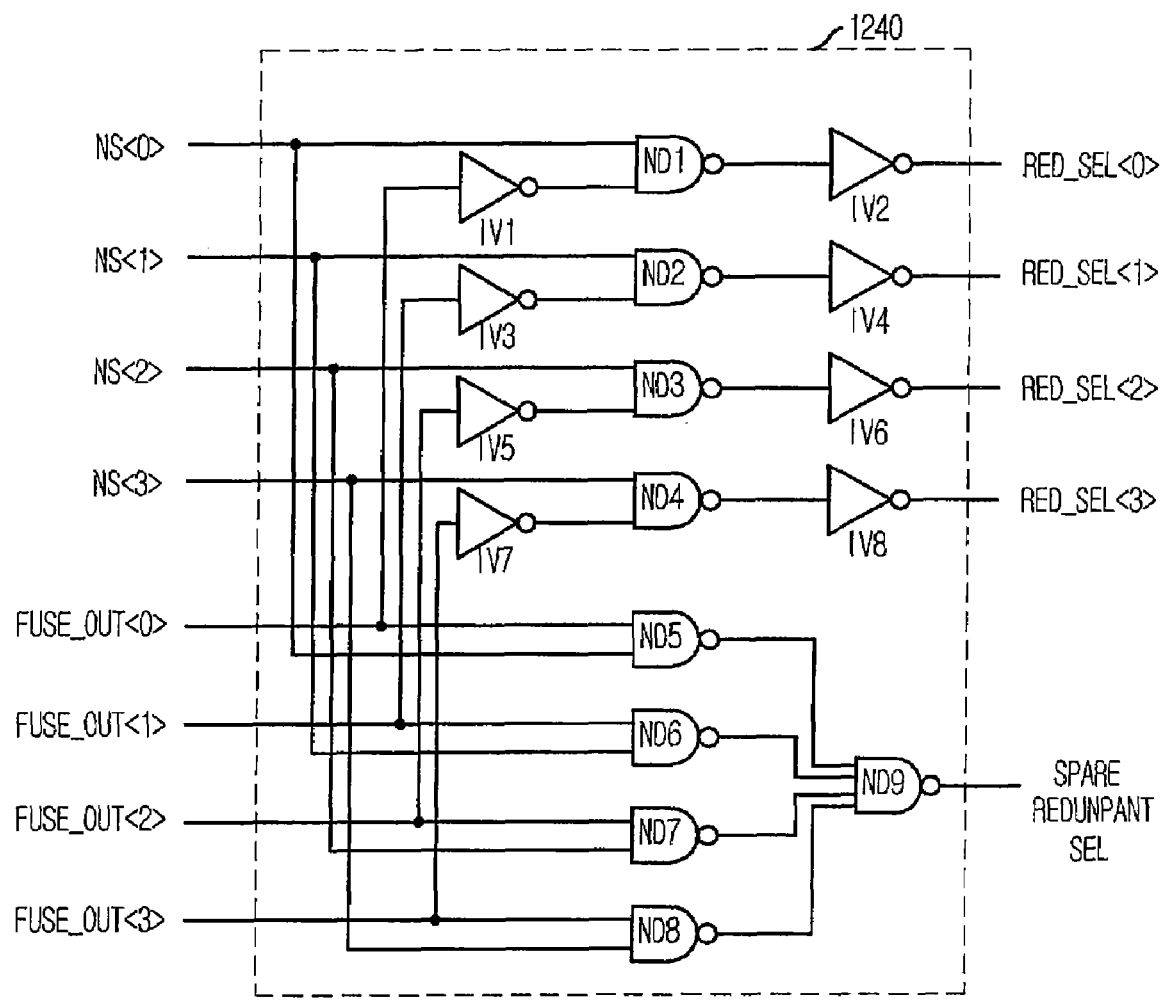
FIG. 13 is a circuit diagram setting forth a detail configuration of a multiplexer in accordance with the second embodiment of the present invention.

FIG. 13 is a circuit diagram setting forth a configuration of the multiplexer 1240 of FIG. 12 in accordance with the second embodiment of the present invention.

Since a logical relation between the input/output signals in the multiplexer 1240 is obvious for those skilled in the art, detail descriptions will be abbreviated herein.

It should be appreciated that a first NAND gate ND1 and a second inverter IV2 may be substituted by one AND gate, and a fifth to a ninth NAND gates may be replaced by one AND gate.

In one embodiment of the present invention, it is possible to reuse the fuse, wherein it is more beneficial to a circuit design of a semiconductor memory device. In addition, since a defective redundancy area can be replaced in virtue of the fuse option, it is possible to also enhance productivity.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device having a redundancy circuit, the redundancy circuit comprising:
   a fuse set controller configured to output a redundancy enable signal enabled according to applied address signals;
   a redundant selector configured to output a redundant selection signal;
   a spare redundant selector configured to output a spare redundant selection signal; and
   a spare fuse controller configured to be controlled by the redundancy enable signal, and to output a selection control signal that selects at least one of the redundant selector and the spare redundant selector in accordance with an internal fuse option during a normal mode.

2. The semiconductor memory device of claim 1, wherein the spare fuse controller is further configured to output a selection control signal that selects at least one of the redundant selector and the spare redundant selector in accordance with a predetermined address signal corresponding to the redundant selection signal during a test mode.

3. The semiconductor memory device of claim 2, wherein the spare fuse controller comprises:
   a spare fuse unit configured to be initialized by a fuse control signal applied from an exterior source, and to output a fuse-out signal having a predetermined logic level corresponding to the internal fuse option; and
   a selecting controller configured to output a selection control signal that selects at least one of the redundant selector and the spare redundant selector in accordance with the plurality of fuse-out signals during a normal mode.

4. The semiconductor memory device of claim 3 wherein the selecting controller is further configured to output a selection control signal that selects at least one of the redundant selector and the spare redundant selector in accordance with a predetermined address signal corresponding to the redundant selection signal during a test mode.

5. The semiconductor memory device of claim 4, wherein the spare fuse unit comprises:
   a plurality of spare fuse output units controlled by the fuse control signal, and configured to output signals of predetermined logic levels corresponding to the internal fuse option;
   a decoder configured to output a plurality of fuse-out signals by decoding the output signal of the plurality of spare fuse output units; and
   a decoder enable signal configured to be controlled by the fuse control signal, and to enable the decoder.

6. The semiconductor memory device of claim 4, wherein the selecting controller comprises:
   a normal selector configured to enable a plurality of normal selection control signals or a spare selection control signal by using the redundancy enable signal and the plurality of fuse-out signals during the normal mode;
   a test mode selector configured to enable a plurality of test mode selection control signals or a test mode spare selection control signal in accordance with a predetermined address signal corresponding to the redundant selection signal enabled during the test mode; and
   a signal coupler configured to perform a logic operation to the plurality of normal selection control signals and the plurality of test mode selection control signals so as to output the redundant selection control signal, and for performing a logic operation to the spare selection control signals and the test mode spare selection control signals so as to output the spare redundant selection control signal.

7. The semiconductor memory device of claim 6, wherein the normal selector comprises:
   a first to a fourth inverters configured to invert each of the plurality of fuse-out signals inputted thereto in parallel;
   a fifth inverter configured to invert the redundancy test signal;
   a first and a fourth AND gates configured to perform a logic AND operation to the outputs of the first to the fourth inverters, a first to a fourth redundancy enable signals, and the output of the fifth inverter; and
   a fifth AND gate configured to perform a logic AND operation to the plurality of fuse-out signals, the first to the fourth redundancy enable signals, and the output of the fifth inverter.

8. The semiconductor memory device of claim 6, wherein the test mode selector is provided with a first to a fifth AND gates configured to perform a logic AND operation to the redundancy test signal and the predetermined address signal inputted thereto in parallel.

9. The semiconductor memory device of claim 6, wherein the signal coupler comprises:
   a first to a fourth OR gates configured to perform a logic OR operation to a first to a fourth normal selection signals and a first to a fourth test mode selection control signals so as to output a first to a fourth redundant selection control signals; and
   a fifth OR gate configured to perform a logic OR operation to the spare selection control signal and the test mode selection control signal so as to output a spare redundant selection control signal.

* * * * *